(12) United States Patent
Yamada

(10) Patent No.: US 7,042,679 B2
(45) Date of Patent: May 9, 2006

(54) MAGNETIC HEAD DEVICE HAVING MAGNETIC HEAD AND BASE PLATE INTERCONNECTED BY FOLDING FLEXIBLE WIRING BOARD

(75) Inventor: Shigeto Yamada, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 9 days.

(21) Appl. No.: 10/326,793

(22) Filed: Dec. 19, 2002

(65) Prior Publication Data

US 2003/0123193 A1    Jul. 3, 2003

(30) Foreign Application Priority Data

Dec. 28, 2001    (JP) .............................. 2001-398739

(51) Int. Cl.
*G11B 21/16* (2006.01)

(52) U.S. Cl. ..................................... 360/241
(58) Field of Classification Search ................ 360/241, 360/281.7, 241.1, 241.2
See application file for complete search history.

(56) References Cited

U.S. PATENT DOCUMENTS 4,905,111 A * 2/1990 Tuma et al. ................. 360/126

FOREIGN PATENT DOCUMENTS

| JP | 60-31703 | 3/1985 |
| JP | 10-74305 | 3/1998 |
| JP | 2000-195015 | 7/2000 |
| JP | 2001-110024 | 4/2001 |

* cited by examiner

*Primary Examiner*—David D. Davis
(74) *Attorney, Agent, or Firm*—Brinks Hofer Gilson & Lione

(57) ABSTRACT

A magnetic head device includes terminal pads formed on a side surface of a magnetic head, the magnetic head being installed on the edge of one surface side of a base plate; and a flexible wiring board comprising a connection terminal portion connected to each of the terminal pads of the magnetic head, a wiring extension portion extended from the connection terminal portion, and an extension terminal portion extended from the wiring extension portion. Herein, the connection terminal portion is disposed on the one surface of the base plate adjacently to the terminal pads of the magnetic head on the base plate; the wiring extension portion is folded back toward the other surface side of the base plate; the extension terminal portion is mounted on the other surface of the base plate; and the connection terminal portion and each of the terminal pads of the magnetic head are electrically interconnected.

5 Claims, 14 Drawing Sheets

MAGNETIC HEAD DEVICE HAVING MAGNETIC HEAD AND BASE PLATE INTERCONNECTED BY FOLDING FLEXIBLE WIRING BOARD

This application claims priority under 35 U.S.C. §119 to Japanese Patent Application 2001-398739 filed on Dec. 28, 2001.

BACKGROUND OF THE INVENTION

1. Field of the Invention

The present invention relates to a magnetic head device used in a state in which a magnetic head is installed on a base plate, and more particularly, to a structure in which a flexible wiring board is used for the wiring for the terminal pads of the magnetic head.

2. Description of the Related Art

With the improvement in recording density and the digitalization of signal recording format, the magnetic head has a trend toward narrowing the track thereof from year to year. As magnetic heads, various MIG (Metal in GAP) type magnetic heads have hitherto been used, each of which has a structure in which a pair of core halves comprising ferrite or ceramic, and constructed by forming thereon metallic magnetic thin films with a superior soft magnetic characteristic, are integrated using a bonding member such as molten glass, with an insulating film interposed between the two core halves.

In recent years, however, in order to make a track narrower than that of the MIG type magnetic head, a thin film magnetic head with a thin film coil has been used as a helical scan type magnetic head for use in a VTR device, a tape storage device or the like.

FIG. 16 shows one construction example of a thin film magnetic head created under such a situation. This thin film magnetic head A has a structure in which core halves 101 and 102 are integrated with a core built-in layer 103 therebetween, and in which a thin film head portion 108 having a thin film portion and a yoke portion is incorporated into the core built-in layer 103 between the core halves 101 and 102. Here, the core half 102 is formed longer than the core half 101, and on the end portion side of the core built-in layer 103 exposed on the side surface of the core half 102, there are provided a coil portion formed within the core built-in layer 103 and terminal pads 117 to 119 connected to the yoke portion.

Also, in the thin film magnetic head A shown in FIG. 16, a medium sliding surface 110 constituted of a slim convex curved surface on which a magnetic medium slides, is formed on the uppermost portions of the core halves 101 and 102. The purpose of forming the medium sliding surface into a convex curved surface in this magnetic head A is to improve the touch between the medium sliding surface and a magnetic tape as a magnetic recording medium.

When the magnetic head A having the configuration shown in FIG. 16 is used as a helical scan type magnetic head, a recess is provided in the peripheral surface of a rotating cylinder, and the magnetic head A is fixed to this recess. Then, the medium sliding surface 110 is disposed on the peripheral surface side of the rotating cylinder so that the medium sliding surface 110 can slide relative to the magnetic tape under the rotation of the rotating cylinder, whereby magnetic recording or reproduction by the magnetic head A can be implemented using the thin film head portion 108 located at the center portion of the medium sliding surface 110. The installation of the magnetic head A on the rotating cylinder is performed by fixing a base material called "base plate" to the recess of the rotating cylinder with installation means such as screws.

FIGS. 17 and 18 are perspective views each showing a state in which the magnetic head A is installed on this type of base plate 120. The base plate 120 is formed of a metallic plate material with an octagonal form in a plan view, and the magnetic head A is fixedly adhered along the base plate 120 at the center of one side end portion on the top surface of the base plate 120. The medium sliding surface 110 side of the magnetic head A is somewhat projected from the end portion of the base plate 120 and fixed. Bonding wires 117a to 119a each formed of a gold line are respectively connected to terminal pads 117 to 119 formed on the side-surface side of the magnetic head A. These bonding wires 117a to 119a are individually routed to the rear surface side of the base plate 120, and are respectively connected to the terminal portions 122 to 124 of a terminal board 121 formed on the rear surface side of the base plate 120.

FIG. 19 is a partially enlarged view showing a rotating cylinder 130 having the base plate 120 on which the magnetic head shown in FIGS. 18 and 19 is installed. The base plate 120 is installed on the recess formed in the outer peripheral portion of a cylindrical rotating cylinder 130, and the medium sliding surface of the magnetic head A can slide relative to a magnetic tape (magnetic recording medium) wound along the peripheral direction of the rotating cylinder 130. The terminal portions 122 to 124 of the terminal board 121 on the rear surface side of the base plate 120 are used as terminals for connecting with the electrical circuitry of electronic components mounted within the rotating cylinder 130.

In the conventional structure shown in FIGS. 16 to 18, the interconnection between the magnetic head A and the terminal board 121 requires connection work by means of bonding wires. Because the magnetic head has been miniaturized from year to year, wire bonding work performed so as to be extended from the surface side to the rear surface side of the base plate 120 with respect to the magnetic head A with a size of e.g., several mm has become extremely complicated work. Therefore, although an automatic machine such as a robot has been employed, the bonding work has not been efficient work in terms of mass-productivity. Also, after performing connection work by wire bonding, a resin layer has been applied to surroundings of the resin layer to cover the surroundings for protecting the bonding wires. However, this work itself is also complicated work, and labor-saving is required for the work.

In order to solve these problems, the present inventor attempted to use a flexible wiring board instead of bonding wires to wire the magnetic head A on the base plate 120.

FIG. 20 is a side view showing a state in which the flexible wiring board is connected to the magnetic head A, and FIG. 21 is a plan view thereof. The flexible wiring board 140 is formed by covering three wiring lines 141 with a thin resin layer 142, and the resin layer 142 comprises a trunk portion 145, a neck portion 146, and a head portion 147. Here, one end portion side of the wiring lines 141 are exposed on one end of the head portion 147, and terminal 117 to 119 are formed on the trunk portion 145.

When the magnetic head is wired using a flexible wiring board 140 instead of bonding wires, it is necessary to fix the head portion 147 of the flexible wiring board 140 to one portion of the surface of the base plate 120, and therefore, the inventor attempted to perform wiring by forming an adhesion layer on the rear surface of the head portion 147, and after adhering one portion of the head portion 147 to one surface side of the base plate 120, and folding back the neck portion 146 from the one surface side to the other surface side of the base plate 120. However, in such an adhesion structure, when attempting to fold back the neck portion 146, one portion of the head portion 147 once adhered to the surface side of the base plate 120 might fall off from the base plate 120 due to the elasticity of the flexible wiring board itself. This causes a problem in reducing the reliability at mass-production.

This type of flexible wiring board 140 is typically produced by injecting resin around a plurality of wiring lines with a predetermined shape, in alignment with one another, and solidifying the resin, thereby forming a thin resin layer 142 for covering the plurality of wiring lines 141. When large amounts of flexible wiring boards 140 are used, the flexible wiring boards 140 in keeping with an intended shape are mass-produced at a mass-production factory in a manner such that large amounts of flexible wiring boards 140 are formed on tape-shaped support members, in alignment with one another, and are carried into the worksite where the magnetic heads are produced together with the tape-shaped support members. Then, the tape-shaped support member is set in a punching device, and the flexible wiring board portions formed on the tape-shaped support members are each aligned with the die hole of the punching device. Thereafter, by punching flexible wiring board portions one after another into an ultimately intended shape using a punch, flexible wiring boards 140 are produced, each of which is to be used in the wiring process of a magnetic head.

However, the flexible wiring board 140 produced by the punching in this manner has had a tendency to cause a portion curled into a round shape under the stress on the cut portion of resin during punching work. In the case where this curled portion occurs at a resin layer portion other than the resin layer portion to be connected to the terminal pads of the magnetic head A, a problem would not particularly occur. However, in the event that the curl portion occurs in the resin layer on the head portion 147 to be directly connected to each of the terminal pads of the magnetic head A, as shown in FIG. 20, there have been risks of causing bad connection, falling-off of ball bonding portions, and/or cracking therein, when the terminal pad portion of the magnetic head A and the wiring end portion located at the curled resin layer portion are to be interconnected by ball bonding.

SUMMARY OF THE INVENTION

Accordingly, it is an object of the present invention to provide, as a magnetic head device requiring wiring from one surface side to the other surface side of a base plate with the magnetic head fixed to the base plate, a magnetic head device that is capable of improving the efficiency of wiring work and that allows reliable wiring by omitting wiring by wire bonding and instead using a flexible wiring board to perform wiring from one surface side to the other surface side of the base plate.

It is another object of the present invention to provide, as a magnetic head device requiring wiring from one surface side to the other surface side of a base plate with the magnetic head fixed to the base plate, a magnetic head device that is capable of improving the efficiency of wiring work by using a flexible wiring board to perform wiring from one surface side to the other surface side of the base plate, and that, even when the base plate is folded from one surface side to the other surface side of the base plate and is fixed, is capable of improving the mountability of the flexible wiring board by preventing the flexible wiring board from partly falling off from the base plate.

It is still another object of the present invention to provide, as a magnetic head device requiring wiring from one surface side to the other surface side of a base plate with the magnetic head fixed to the base plate, a magnetic head device that is capable of improving the efficiency of wiring work by using a flexible wiring board to perform wiring from one surface side to the other surface side of the base plate, and that, even when the flexible wiring board is produced by punching, prevents the possibility that a curled portion caused by punching affects connection portions between the curled portion and each of the terminal pads of the magnetic head.

To solve the above-described problems, the present invention provides, in a first aspect, a magnetic head device that has, on a base plate, a magnetic head for reading out or writing information by moving relative to a magnetic recording medium. This magnetic head device includes terminal pads formed on a side surface of the magnetic head, the magnetic head being installed on the edge portion of one surface side of the base plate; and a flexible wiring board that includes a connection terminal portion connected to each of the terminal pads of the magnetic head, a wiring extension portion extended from the connection terminal portion, and an extension terminal portion extended from the wiring extension portion, and that is formed by covering a plurality of wiring lines with a resin layer. Herein, the connection terminal portion is fixed to the one surface of the base plate adjacently to the terminal pads of the magnetic head on the base plate; the wiring extension portion is folded back toward the other surface side of the base plate through the side including the edge portion of the magnetic head installation portion on the base plate; the extension terminal portion is fixed to the other surface side of the base plate; and the connection terminal portion and each of the terminal pads of the magnetic head are electrically interconnected.

As compared with the conventional structure, in which the magnetic head and the rear surface side of the base plate are wire-bonded, the magnetic head device according to the present invention, in which the magnetic head and the base plate are interconnected by folding the flexible wiring board, eliminates the need for the routing work of bonding wires accompanying wire bonding work, which has hitherto been necessary, and thereby the risk of bad connection due to the breakage of the bonding wires is obviated.

In a magnetic head that is miniaturized into a size of several mm, as compared with performing wire bonding work from the surface side to the rear surface side of the base plate without causing a plural bonding wires to make contact with one another, performing wiring work by folding back the flexible wiring board is extremely easy and also prevents the risk of a short-circuit. In addition, since each of the wiring lines of the flexible wiring board is covered with a resin layer in advance and formed at predetermined positions, it is also easy to position the magnetic head with respect to each of the terminal pads, thereby enabling electrical connection work to be reliably performed.

To solve the above-described problems, the present invention provides, in a second aspect, a magnetic head device that has, on a base plate, a magnetic head for reading out or writing information by moving relative to a magnetic recording medium. This magnetic head device includes terminal pads formed on a side surface of the magnetic head, the magnetic head being installed on the edge portion of one surface side of the base plate; and a flexible wiring board that includes a connection terminal portion connected to each of the terminal pads of the magnetic head, a wiring extension portion extended from the connection terminal portion, and an extension terminal portion extended from the wiring extension portion, and that is formed by covering a plurality of wiring lines with a resin layer. Herein, the connection terminal portion is fixed to the one surface of the base plate adjacently to the terminal pads of the magnetic head on the base plate; the wiring extension portion is folded back toward the other surface side of the base plate through the side including the edge portion of the magnetic head installation portion on the base plate; the extension terminal portion is fixed to the other surface side of the base plate; and the connection terminal portion and each of the terminal pads of the magnetic head are electrically interconnected. Here, the wiring extension portion of the flexible wiring board having a folded part or a bent part formed, and an adhesion layer that makes contact, along at least the outer peripheral portion of the folded part or bent part, with the outer peripheral portion and the base plate.

As compared with the conventional structure, in which the magnetic head and the rear surface side of the base plate are wire-bonded, the magnetic head device according to the present invention, in which the magnetic head and the base plate are interconnected by folding the flexible wiring board, eliminates the need for the routing work of bonding wires accompanying wire bonding work, which has hitherto been necessary, and thereby the risk of bad connection due to the breakage of the bonding wires is obviated.

When, along the outer peripheral portion of the folded part or bent part of the wiring extension portion, the adhesion layer is provided so as to make contact with the aforementioned outer peripheral portion and the one surface of the base plate, the adhesion layer prevents the flexible wiring board from falling off when the wiring extension portion is folded along the side including the edge portion of the base plate. Also, when the adhesion layer is provided only along the outer peripheral portion of the folded part or bent part of the wiring extension portion, the adhesion layer can be saved compared with the case where adhesion layer is provided in large quantity so as to cover the entire wiring extension portion. Furthermore, when the wiring extension portion is folded along the side including the edge portion of the base plate, peel strength acts along the outer peripheral portion side of the wiring extension portion or the bent portion stronger than along the inner peripheral portion side thereof, and therefore, providing the adhesion layer on this outer peripheral portion more effectively prevents the flexible wiring board from falling off.

To solve the above-described problems, the present invention provides, in a third aspect, a magnetic head device that has, on a base plate, a magnetic head for reading out or writing information by moving relative to a magnetic recording medium. This magnetic head device includes terminal pads formed on a side surface of the magnetic head, which is installed on the edge portion of one surface side of the base plate; and a flexible wiring board that includes a connection terminal portion connected to each of the terminal pads of the magnetic head, a wiring extension portion extended from the connection terminal portion, and an extension terminal portion extended from the wiring extension portion, and that is formed by covering a plurality of wiring lines with a resin layer. Herein, the connection terminal portion is disposed on the one surface of the base plate adjacently to the terminal pads of the magnetic head on the base plate; the wiring extension portion is folded back toward the other surface side of the base plate through the side including the edge portion of the magnetic head installation portion on the base plate; the extension terminal portion is mounted on the other surface side of the base plate; and the connection terminal portion and each of the terminal pads of the magnetic head are electrically interconnected. Here, the end portion on the side of the magnetic head, of the connection terminal portion of the flexible wiring board being bent in the direction approaching the one surface of the base plate along the thickness direction of the connection terminal portion, on the one surface of the base plate.

As compared with the conventional structure, in which the magnetic head and the rear surface side of the base plate are wire-bonded, the magnetic head device according to the present invention, in which the magnetic head and the base plate are interconnected by folding the flexible wiring board, eliminates the need for the routing work of bonding wires accompanying wire bonding work, which has hitherto been necessary, and thereby the risk of bad connection due to the breakage of the bonding wires is obviated.

In the case where the connection terminal portion of the flexible wiring board has been bent so as to approach the one surface side of the base plate along the thickness direction of the connection terminal portion, with respect to the terminal pads of the magnetic head provided on the base plate, when each of the terminal pads and the connection terminal portion is interconnected by ball-bonding, bad connection hardly occurs, and consequently, the risk of falling-off of the ball bonding portion is low, as well as the risk of crack generation in the ball bonding portion is low, as compared with the case where the connection terminal portion has been bent in the direction opposite to the aforementioned direction.

In the magnetic head device according to the present invention, it is preferable that the magnetic head comprise a core block, a magnetic core portion formed at the front end surface side of the core block, and a medium sliding surface including the magnetic core portion, that the magnetic head be fixed to the edge portion in the state in which the magnetic core portion is positioned outside the base plate with the core block partly projected from the edge portion of the base plate, and that, in the wiring extension portion of the flexible wiring board, the part folded along the edge portion of the base plate be positioned in the gap between the moving locus of a magnetic tape sliding relative to the medium sliding portion of the magnetic head and the edge portion of the base plate.

By disposing the wiring extension portion in the gap between the magnetic tape and the edge portion of the base plate when the magnetic tape slides relative to the medium sliding surface of the magnetic head, it is possible to pass the wiring extension portion in the proximity of the medium sliding surface of the magnetic head from the terminal pad connection portion, and wrap it around the base plate to the rear surface side thereof in the shortest distance, and to implement the connection in the shortest distance with respect to the other surface of the base plate by the flexible wiring board.

In the magnetic head device according to the present invention, it is preferable that, in the magnetic head, a pair of block-shaped core halves be joined together with a core built-in layer sandwiched between side surfaces of the core halves, that one of the core halves be formed longer than the other thereof, that one portion of the core built-in layer of the one core half be exposed, and that the terminal pads be formed at the exposed portion of the core built-in layer on the side surface of the one core half.

Thereby, a magnetic head having a configuration in which the terminal pads are disposed at the exposed portion of the core built-in layer on the side-surface side of the one core half can be implemented, and by disposing the magnetic head on the base plate, it is possible to achieve the arrangement of the present invention to which a flexible wiring board is connected.

In the magnetic head device according to the present invention, it is preferable that a folded part or a bent part be formed at the wiring extension portion of the flexible wiring board, and that the folded part or a bent part be disposed on the one surface of the base plate so that the connection terminal portion wraps around the side of the shorter core half of the magnetic head therealong in the state in which the connection terminal portion of the flexible wiring board is connected to each of the terminal pads of the magnetic head.

With this arrangement, it is possible to cause the wiring extension portion of the flexible wiring board to wrap around the base plate to the other surface side of the base plate in the shortest distance, in a manner such that the wiring extension portion wraps around the side portion of the core half, and that after passing through the edge portion of the base plate, the wiring extension portion is folded back to the other surface side of the base plate.

In the magnetic head device according to the present invention, it is preferable that a through-hole be formed in the outer peripheral portion of the folded part or bent part of the wiring extension portion of the flexible wiring board, and that the adhesion layer be provided so as to make contact with the wiring extension portion and the surface of the one surface side of the base plate through the through-hole.

By providing the adhesion layer so as to make contact with the folded part or bent part of the wiring extension portion and the base plate, and disposing the adhesion layer so as to make contact with the surface of the base plate via the through-hole provided in the folded part or bent part, the adhesion layer can be adhered to the surface of the base plate via the through-hole, thereby improving the adhesion of the wiring extension portion provided by the adhesion layer. In addition, when the adhesion layer is provided on the outer peripheral portion of the folded part or bent part of the wiring extension portion, the adhesion layer is capable of increasing the area to which the adhesion layer adheres on the one surface of the base layer, thereby further improving the adhesion.

In the magnetic head device according to the present invention, it is preferable that an adhesion layer be provided so as to run over from both sides in the width direction, of the folded part or bent part of the wiring extension portion of the flexible wiring board, making contact with the surface portion of the base plate.

It is also possible to adhere the wiring extension portion on the surface of the base plate by providing the adhesion layer so as to run over from both sides in the width direction, of the folded part or bent part of the wiring extension portion, making contact with the surface portion of the base plate.

In the magnetic head device according to the present invention, it is preferable that the flexible wiring board comprise a flexible resin layer and wiring lines embedded therein, that one end portion of each of the wiring lines be exposed on one surface side of the resin layer at the connection terminal portion of the flexible wiring board, that the resin layer be produced by punching-out performed by driving a punch into the die hole of a die, and that the flexible wiring board be produced by punching out from the other surface side of the resin layer.

When the flexible wiring board has been produced by punching out resin by driving a punching tool such as a punch into a die hole from the side where the wiring lines are unexposed in the connection terminal portion, the connection terminal portion bends so as to approach the one surface of the base plate along the thickness direction thereof, in the connection terminal portion with wiring lines. As a result, when the connection terminal portion is ball-bonded to each of the terminal pads of the magnetic head, bad connection hardly occurs, and consequently, the risk of falling off of the ball bonding portion is low, as well as the risk of crack generation in the ball bonding portion is low, as compared with the case where the connection terminal portion bends in the direction opposite to the aforementioned direction.

The above and other objects, features, and advantages of the present invention will become clear from the following detailed description of the preferred embodiments of the invention in conjunction with the accompanying drawings.

DESCRIPTION OF THE PREFERRED EMBODIMENTS

First Embodiment

Hereinafter, a first embodiment according to the present invention will be described with reference to the accompanying drawings. It is to be understand that the present invention is not limited to the following embodiments.

Figure 1:
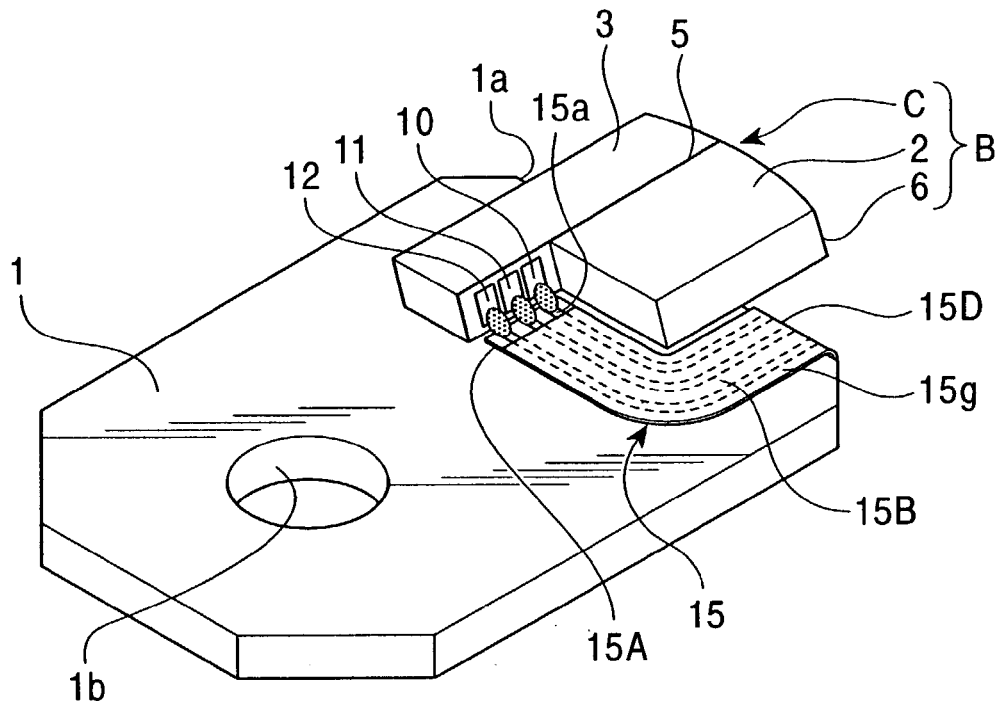
FIG. 1 is a perspective view showing a first embodiment of a magnetic head device according to the present invention in which a magnetic head is installed on a base plate.
Figure 2:
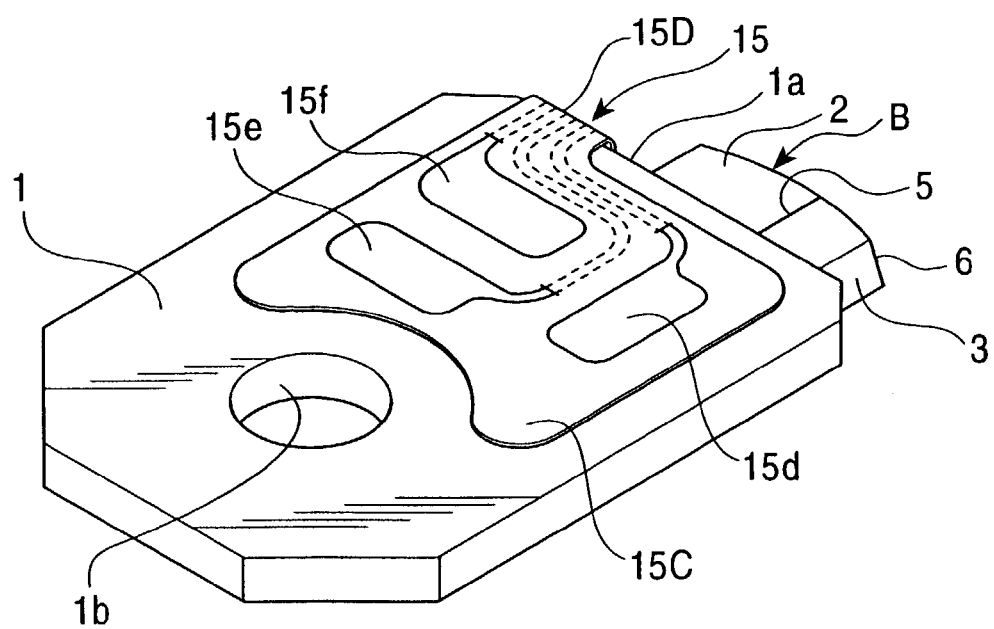
FIG. 2 is a perspective view showing the magnetic head device shown in FIG. 1, when viewed from the rear surface side of the base plate.

FIGS. 1 and 2 show a state in which the first embodiment of a thin film magnetic head B according to the present invention is installed to a base plate 1 for installing a rotating cylinder for use in a magnetic recording device such as a VTR or a tape storage device.

The thin film magnetic head B in this embodiment comprises a core block C formed by integrally adhering block-shaped core halves 2 and 3 into a planar form with a core built-in layer 5 sandwiched between the side end faces of the core halves. One of the surfaces having larger areas, of the core halves 2 and 3 (in FIG. 1, this is the bottom surface side of the core halves 2 and 3, which lie sideways) is adhered to the surface (one surface) of one side edge portion of the base plate 1. The thin film magnetic head B is fixed to the base plate 1 in the state in which one side of each of the core halves 2 and 3 is somewhat projected outward from an end portion of the base plate 1.

These core halves 2 and 3 comprises a ceramic material with a superior anti-wear characteristic, such as $CaTiO_3$ or $(Al_2O_3+TiC)$, or a magnetic material such as ferrite or the like.

Figure 4:
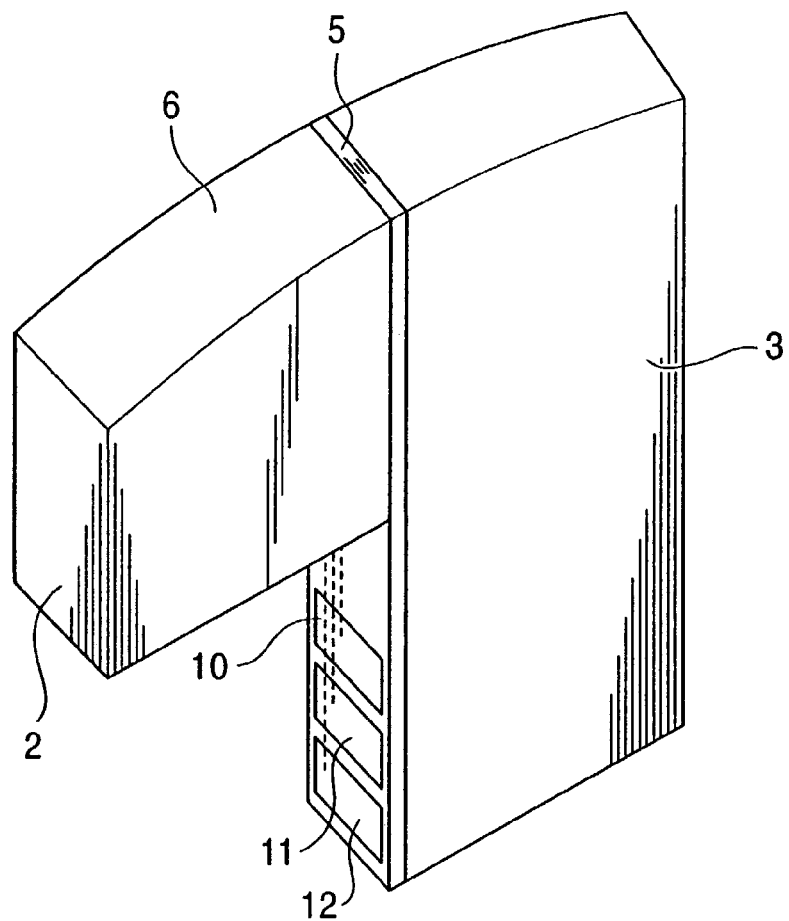
FIG. 4 is a perspective view showing the magnetic head provided in the magnetic head device according to the present invention.

FIG. 4 is a perspective view of the magnetic head shown in FIGS. 1 and 2, viewed from the medium sliding surface.

The one surface of the thin film magnetic head B projected outside the base plate 1 has been worked into a medium sliding surface 6 with a shape of a slim convex curved surface. A magnetic head core comprising a write core portion and a read core portion is incorporated into the core built-in layer 5 portion exposed at the central part of the medium sliding portion 6, and a magnetic pole at the front end of each of the core portions is exposed at the central part of the medium sliding portion 6, whereby the thin film magnetic head B can write and read magnetic information with respect to a magnetic recording medium such as a magnetic tape moving relative to the medium sliding surface 6.

These magnetic head core portions may have any of a thin film magnetic head configuration, an MR (Magneto-Resistive) effect type magnetic head configuration, a GMR (Giant Magneto-Resistive) effect type magnetic head configuration, a TMR (Tunnel Magneto-Resistive) effect type magnetic head configuration, and the conventional MIG type magnetic head configuration. However, in a magnetic head that has been more improved in the recording density, it is desirable that the magnetic head core portions have an MR effects type magnetic head configuration, GMR effect type magnetic head configuration, or TMR effect type magnetic head configuration.

The above-described core half 2 has a length about half the core half 3. At the core built-in layer 5 portion, which is located on the side surface of the longer core half 3, there is provided terminal pads 10 to 12 for connecting to the write coil at the magnetic head core portion provided in the core built-in layer 5, to an MR element for reading provided that the magnetic head is of an MR type, or to a GMR element for reading provided that the magnetic head is of a GMR type.

More specifically, since the core half 2 is formed shorter than the core half 3, the end portion side of the core built-in layer 5 provided on the side-surface side of the core half 3 are partly exposed, and the terminal pads 10, 11, and 12 are formed on the end portion side of the core built-in layer 5 in neat alignment in that order from the side nearer to the medium sliding surface 6. Here, the number of these terminal pads is not particularly limited. Two, four, or more terminal pads may be used in keeping with the number of terminals necessary for the magnetic head core portion provided in the core built-in layer 5.

In the core halves 2 and 3, in order to form an azimuth angle when they slide relative to the magnetic recording medium such as a magnetic tape, they are not worked into a mere prism having a rectangular cross section, but worked into a prism having a parallelogramatic cross section. Therefore, each of the terminal pads 10 to 12 is not perpendicular to the surface (one surface) of the base plate 1, but is inclined with respect to the normal to the surface (one surface) of the base plate 1.

Figure 19:
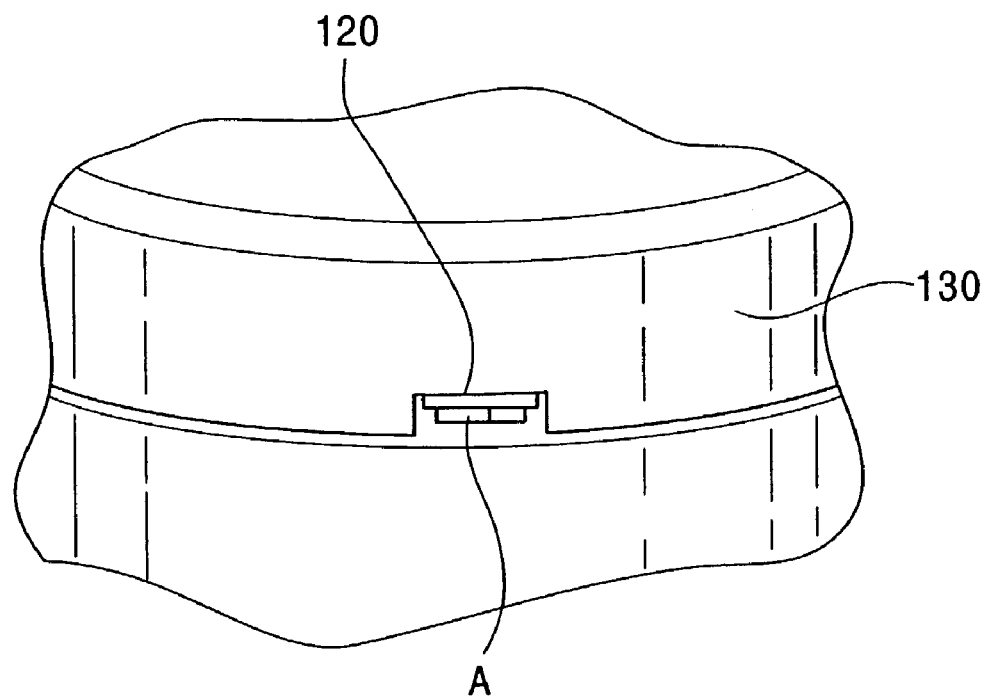
FIG. 19 is a perspective view showing the portion installed on a rotating cylinder, of the conventional magnetic head device shown in FIGS. 16 and 17.

Next, the base plate 1 on which the magnetic head B is fixed, is formed into an octagonal shape in a plan view obtained by obliquely cutting the end portions of a metallic plate with a rectangular form in a plan view, and a magnetic head B is fixed to the central part of the edge portion 1a of the surface of one side end portion in the longitudinal direction of the base plate 1. Also, an installation hole 1b for screwing the base plate 1 in a rotating cylinder 130, for example, shown in FIG. 19, is formed at the central part of the other side portion in the longitudinal direction of the base plate 1. Here, the shape of the base plate 1 is not restricted to this shape. Alternatively, a shape such that has a projected portion at the central part of the edge portion 1a, and that the magnetic head B is fixed to this projected portion, may be used as a matter of course.

On the side of the right side portion (in FIG. 1) of the edge portion 1a along the sliding direction of the magnetic tape or the like, of the base plate 1, a flexible wiring board 15 is installed so as to detour around the shorter core half 2. The flexible wiring board 15 comprises a connection terminal portion 15A having the end portions of the wiring lines 15a to 15c for respectively connecting with the terminal pads 10 to 12; a wiring extension portion 15B which is extended from the connection terminal portion 15A, which, after being folded or bent into an L-shape, are wrapped around the base plate 1 to the rear surface thereof, and in which the above-described wiring lines 15a to 15c are incorporated; and an extension terminal portion 15C which is extended up to the front end side of the wiring extension portion 15B, which is adhered on the rear surface of the base plate 1, and in which the wiring lines 15a to 15c are incorporated.

The flexible wiring board 15 is configured so that surroundings of the metallic wiring lines 15 to 15c are covered with a thin resin covering layer 15g, and because either of the metallic conductors or the thin resin covering layer has flexibility, the flexible wiring board 15 is deemed to be superior in the flexibility in its entirety.

In the connection terminal portion 15A of the flexible wiring board 15, the end portions of three wiring lines 15a to 15c are exposed in alignment with one another, and the connection terminal portion 15A is adhered to the edge portion 1a of the base plate 1 in a state in which the end portions of the wiring lines 15a to 15c, respectively, are in close proximate to the terminal pads 10 to 12 of the magnetic head B. The wiring extension portion 15B folded or bent into an L-shape detours around the core half 2 along the side portion of the core half 2, on the surface side of the base plate, and is folded toward the rear surface side of the base plate 1 through the folded portion 15D, which is pressed against the side constituting the edge portion 1a of the base plate 1. Then, the extension terminal portion 15C extended up to the front end side of the bent wiring extension portion 15B, is adhered to the portion with an area about half that of the rear surface side of the base plate 1, as shown in FIG. 2. On the surface side of the extension terminal portion 15C, there are provided terminal portions 15d to 15f as wiring end portions respectively connected to the end portions of the above-described wiring lines 15a to 15c, and the terminal portions 15d to 15f are exposed on the surface side of the extension terminal portion 15C. These terminal portions 15d to 15f are used as connection terminals with respect to the electrical circuitry having electronic components mounted within the rotating cylinder 130 shown in FIG. 19.

With regard to the folded portion 15D of the flexible wiring board 15, this portion is located on a side of the core half 2 of the magnetic head B on the edge portion 1a of the base plate 1. Even when the magnetic tape T as a magnetic recording medium is caused to make relative sliding to the medium sliding surface 6 of the magnetic head B as shown in FIG. 3, since the above-described folded portion 15D corresponds to a gap portion between the magnetic tape T making relative sliding and the edge portion 1a of the base plate 1 because the medium sliding portion 6 is located at a position somewhat projected from the edge portion 1a of the base plate 1a, it is possible to fold and dispose the folded portion 15D of the flexible wiring board 15 without causing any interference with the magnetic tape T.

Figure 3:
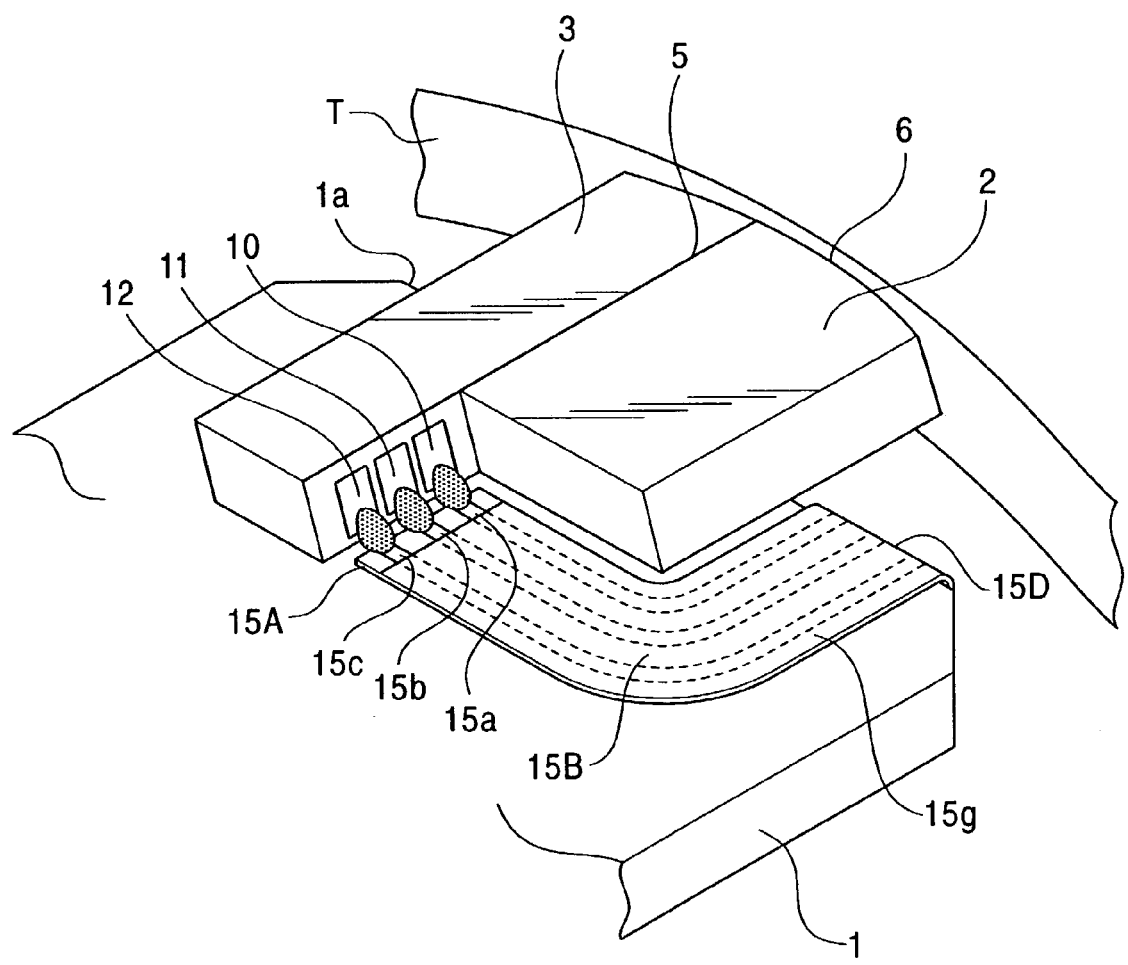
FIG. 3 is an exploded perspective view showing the installation portion of the magnetic head in the magnetic head device shown in FIG. 1, and a magnetic tape sliding relative to the magnetic head.

For installing the flexible wiring board 15 with the configuration shown in FIGS. 1 to 3 on the base plate 1, firstly an adhesion layer is applied over the rear surface of the flexible wiring board 15 in advance, and the base plate 1 is prepared. Then, the connection terminal portion 15A and the wiring extension portion 15B of the flexible wiring board 15 are disposed on the base plate 1 so as to detour the installation position of the core half 2 along the side of the core half 2 of the magnetic head B to be installed to the base plate 1 as described later, and they are adhered to the base plate. Thereafter, the wiring extension portion 15B is folded along the side of the edge portion 1a of the base plate 1 to form the folded portion 15D. Furthermore, the extension terminal portion 15C is caused to wrap around the base plate 1 to the rear surface side (the other surface) thereof, and the extension terminal portion 15C is adhered to the rear surface side of the base plate 1.

Next, the magnetic head B separately produced in advance is fixedly adhered to the central part of the edge portion 1a of the base plate 1. Here, the magnetic head is fixed to the base plate 1 so that the terminal pads 10 to 12 and the terminal portion wiring lines 15a to 15c of the flexible wiring board 15 adjacently face, respectively.

Figure 5:
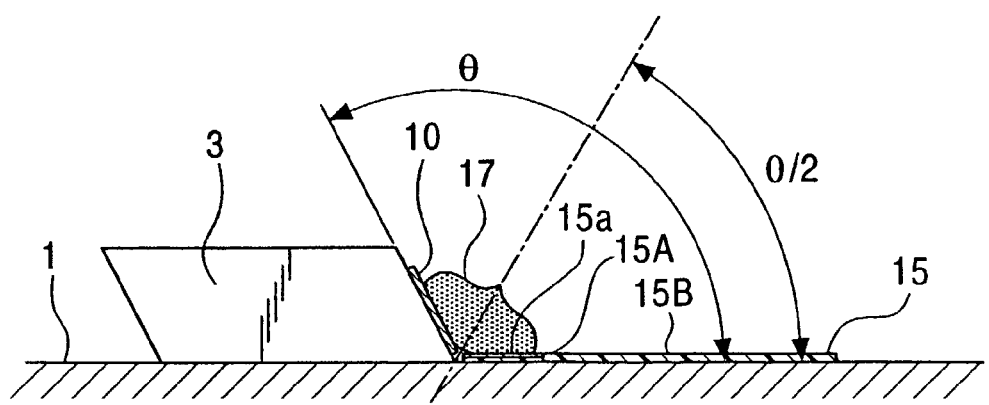
FIG. 5 is a sectional view showing a ball bonding portion between a terminal pad in the magnetic head of the magnetic head device and a flexible wiring board shown in FIG. 1.

After that, as shown in FIG. 5, ball bonding is performed in which a bonding ball is formed so as to cover the terminal pad 10 and the terminal portion wiring line 15a, thereby electrically connecting the terminal pad 10 and the terminal portion wiring line 15a. Furthermore, electrical connection between the terminal pad 11 and the terminal portion 15b, and that between the terminal pad 12 and the terminal portion 15c are also successively established, thereby completing the interconnection between the magnetic head B and the flexible wiring board 15.

As described above, each of the terminal pads 10 to 12 is inclined with respect to the normal to the surface of the base plate 1, and therefore, when ball bonding is performed for establishing connection with bonding ball formed, it is desirable, for preventing bad connection, to perform bonding by pressing a bonding ball from an angle about half the inclining angle $\theta$ of the terminal pads 10–12 shown in FIG. 5 with respect to the surface of the base plate 1, that is, from the direction of an angle of $\theta/2$.

By performing the connection work between the magnetic head B and the flexible wiring board 15 as described above, it is possible to very easily perform wiring work, as compared with the conventional wiring work in which wiring with respect to the rear surface side of the base plate has been performed by wire bonding using three golden wires. That is, in this embodiment, one time folding work of the wiring extension portion 15B of the flexible wiring board 15 enables wiring from the surface side to the rear surface side of the base plate 1, as compared with the conventional process in which wiring work using three bonding wires from the surface side to the rear surface side has been performed. In addition, since the wiring lines 15a to 15c of the flexible wiring board 15 is covered in advance with a thin resin layer 15g for protection, it is not necessary to form an extra resin layer for protection after the wiring work, and also the risk of causing breakage of wires during wiring work is very low.

In this embodiment, the wiring work from the surface side to the rear surface side of the base plate can be performed in the shortest distance by using the arrangement in which the wiring extension portion 15B of the flexible wiring board 15 is folded back to the rear surface side of the base plate 1 through the edge portion 1g on the side of the installation position of the magnetic head B. This allows the length of the wiring extension portion 15B to be the shortest. As another possible method, there is one in which the wiring lines are folded so as to pass through the right side surface (in FIG. 1) of the base plate 1. In this case, however, as a general tendency, the wiring distance up to the rear surface side of the base plate becomes long, thereby lengthening the wiring extension portion 15B of the flexible wiring board 15.

Since the magnetic head B is sufficiently small with respect to the base plate 1, the above-described arrangement in which the flexible wiring board 15 is folded back to the rear surface of base plate 1 through the edge portion 1g on the side of the installation position of the magnetic head B, becomes an optimum configuration that implements the shortest distance wiring. With this arrangement, it is possible to reduce the length of the wiring lines to a minimum, and suppress DC resistance of the wiring lines.

Meanwhile, in the processes described above, the process order was set so that the flexible wiring board 15 is adhered to the base plate 1 before the magnetic head B is fixed to the surface side of the base plate 1. Conversely, however, the flexible wiring board 15 may naturally be adhered to the base plate 1 after the magnetic head B has been fixed to the surface side of the base plate 1. Furthermore, when the flexible wiring board 15 is to be adhered to the base plate 1, the process order may naturally be as follows: (1) the extension terminal portion 15C is adhered to the rear surface side of the base plate 1, (2) the wiring extension portion 15B of the flexible wiring board 15 is folded toward the surface side of the base plate 1 through the edge portion 1*a* of the base plate 1, and (3) the connection terminal portion 15A is adhered to the surface side of the base plate 1.

Second Embodiment

Figure 6:
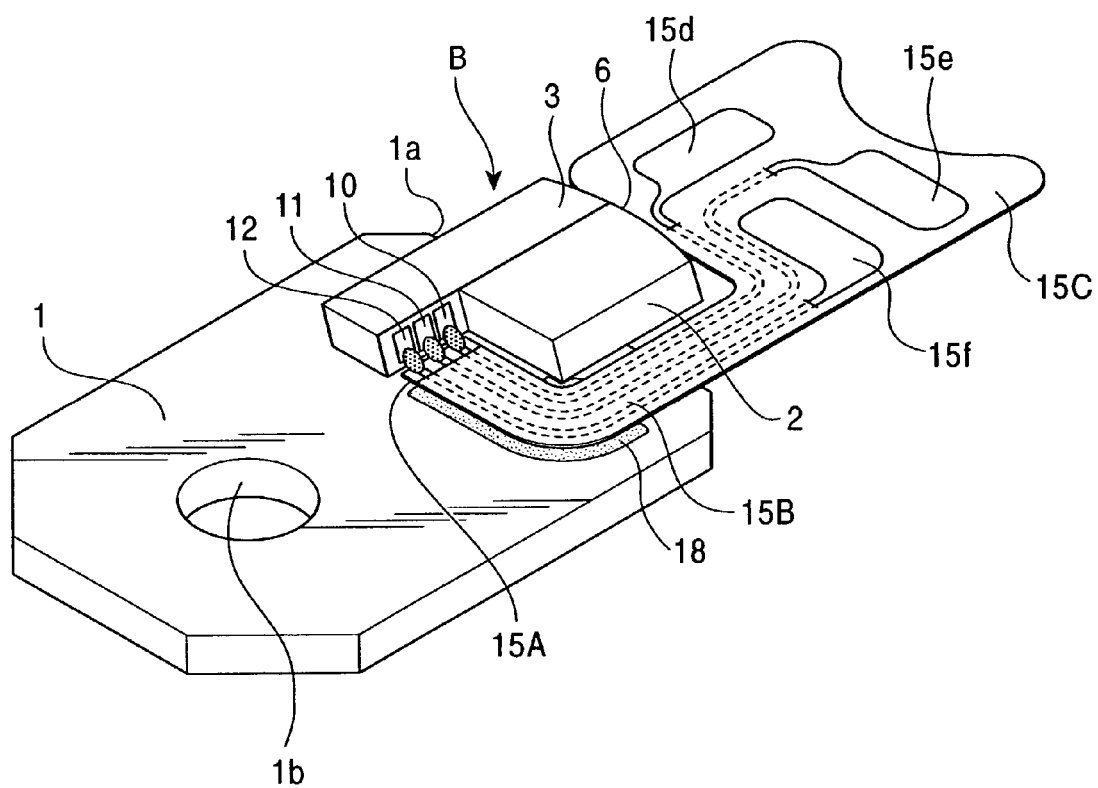
FIG. 6 is a perspective view showing a second embodiment of a magnetic head device according to the present invention.
Figure 7:
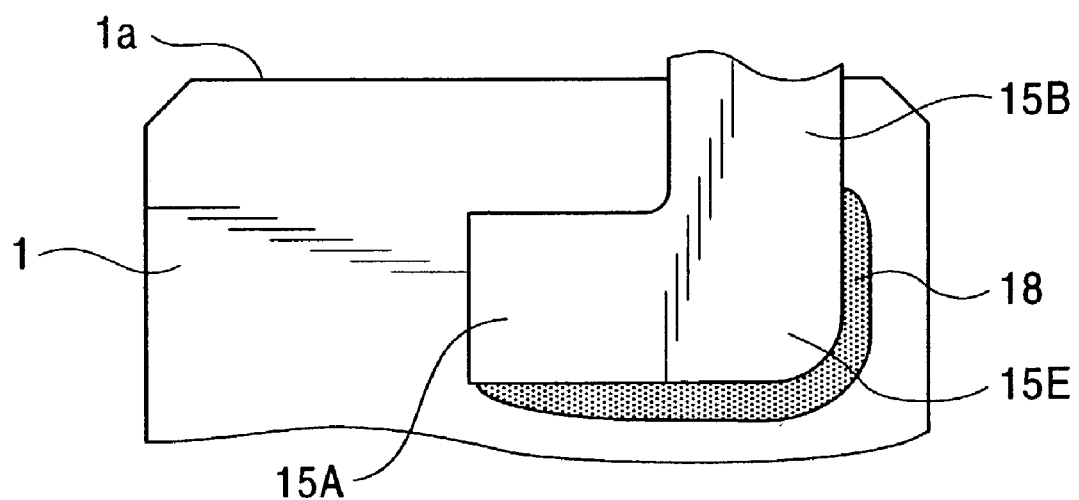
FIG. 7 is a representation explaining a first example of an installation portion with respect to a base plate, of the flexible wiring board applied to the magnetic head device shown in FIG. 6, and of a resin adhesion layer.
Figure 8:
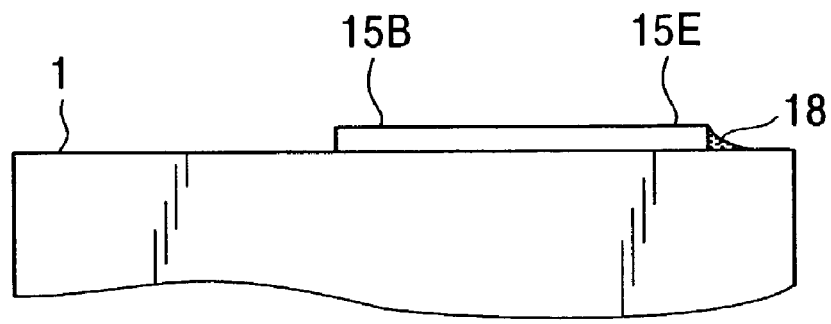
FIG. 8 is a sectional view showing the installation portion of the flexible wiring board and the resin adhesion layer portion shown in FIG. 7.

FIGS. 6 to 8 show a magnetic head device according to a second embodiment of the present invention in which the magnetic head B is installed on the base plate 1. This flexible wiring board 15 has a structure in which side portions of the extension terminal portion 15B are fixed with a resin adhesion layer in addition to forming an adhesion layer on the rear surface of the flexible wiring board 15.

In the structure of this embodiment, because the arrangement of the base plate 1 and that of the magnetic head B are equal to that of the above-described embodiment, the same reference numerals designate the same portions in these arrangements, and the descriptions of the same portions are omitted.

In the magnetic head device D of this embodiment, along a bent portion 15E, which has a rounded corner portion on the outside, of the L-shaped wiring extension portion 15B of the flexible wiring board 15, an adhesion layer 18 ranging from the bent portion 15E to the vicinity of the end portion of the connection terminal portion 15A is formed into a fillet-shape so as to make contact with the surface of the base plate 1 and the bent portion 15E, as shown in FIG. 8. Other arrangements are equal to those of the above-described embodiment.

FIG. 6 illustrates a state of the magnetic head device D before the flexible wiring board 15 thereof is folded back to the rear surface side of the base plate 1. In actuality, however, as in the case of the magnetic head device shown in FIGS. 1 to 3, the wiring extension portion 15B of the flexible wiring board 15 is folded back, and after being positioned on the rear surface side of the base plate 1, the extension terminal portion 15C is adhered thereto.

If, as in this embodiment, an adhesion layer 18 is provided along the outer peripheral portion of the bent portion 15E of the wiring extension portion 15B, and the bent portion 15E of the wiring extension portion 15B is strongly adhered to the base plate 1, when the wiring extension portion 15B is folded along the side of the edge portion 1*a* of the base plate 1 from the state shown in FIG. 6, the wiring connection portion 15A and the part of the wiring extension portion 15B adjacent thereto are prevented from falling off from the base plate 1. This improves the adhesion strength of the wiring connection portion 15A with respect to the base plate 1.

When the wiring extension portion 15B is folded along the side of the edge portion 1*a* of the base plate 1, peel strength acts mainly on the bent portion 15E of the wiring extension portion 15B and the wiring connection portion 15A, which are the most remote from the folded portion of the wiring extension portion 15B. However, since the adhesion layer 18 is provided to the bent portion 15E portion and the surroundings thereof, the falling-off of the wiring extension portion 15B and the wiring connection portion 15A can be effectively prevented.

Figure 9:
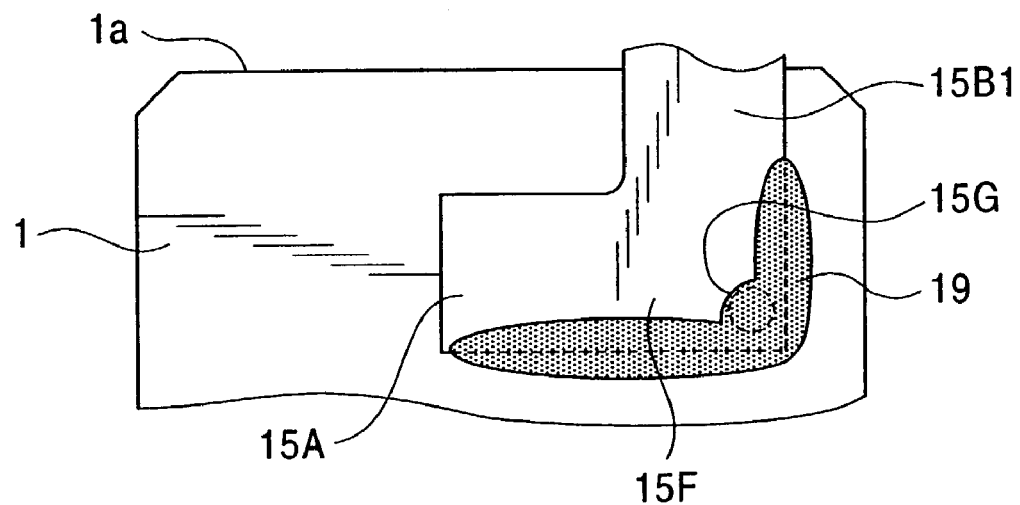
FIG. 9 is a representation explaining a second example of an installation portion with respect to the base plate, of the flexible wiring board applied to the magnetic head device shown in FIG. 6, and of a resin adhesion layer.

FIG. 9 shows a configuration where a wiring extension portion 15B1 of the flexible wiring board 15 is bent into an shape, a through-hole 15G is formed inside the bent portion 15F of the wiring extension portion 15B1, and wiring extension portion 15B1 is covered in a manner such that the adhesion layer 19 covers the through-hole to reach the surface of the base plate 1, and that the adhesion layer 19 is applied so as to cover the outside portion of the folded portion 15F, whereby the wiring extension portion 15B1 of the flexible wiring board 15 is adhered to the base plate.

By the adhesion structure shown in FIG. 9, the adhesion layer 19 covers the outside portion of the wiring extension portion 15B1 and reaches the surface of the base plate 1, and thereby the wiring extension portion 15B1 is adhered to the base plate, and simultaneously, the adhesion layer 19 reaches the surface of the base plate 1 via the through-hole 15G. This enhances the adhesion strength of the wiring extension portion 15B1.

When the wiring extension portion 15B1 is folded along the edge portion 1*a* of the base plate 1, peel strength acts mainly on the bent portion 15E of the wiring extension portion 15B1 and the wiring connection portion 15A, which are remote from the folded position of the wiring extension portion 15B1. However, since the adhesion layer 19 is provided to the bent portion 15E portion and the surroundings thereof for increasing the adhesion force, the falling-off of the wiring extension portion 15B1 and the wiring connection portion 15A can be effectively prevented.

Figure 10:
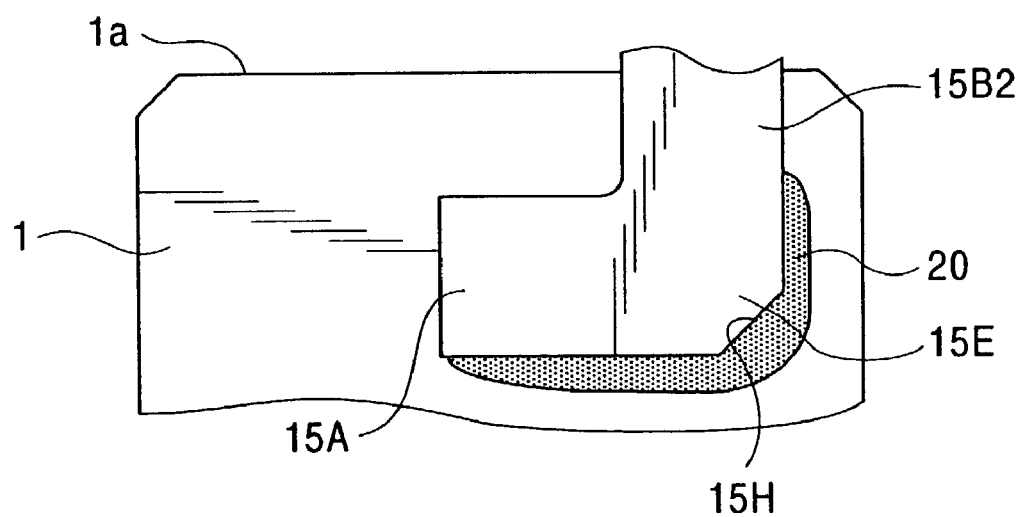
FIG. 10 is a representation explaining a third example of an installation portion with respect to the base plate, of the flexible wiring board applied to the magnetic head device shown in FIG. 6, and of a resin adhesion layer.

FIG. 10 shows a configuration in which a wiring extension portion 15B2 of the flexible wiring board 15 is bent into an L-shape having an inclined portion 15H at the corner portion, and in which an adhesion layer 20 is applied so as to cover the outside portion of the inclined portion 15H, whereby the wiring extension portion 15B2 of the flexible wiring board 15 is adhered to the base plate. Other arrangements are equal to those of the above-described embodiment shown in FIG. 6.

In the structure of this example, when a wiring extension portion 15B2 is folded along the side of the edge portion 1*a* of the base plate 1, peel strength acts mainly on the inclined portion 15H of the wiring extension portion 15B2 and the wiring connection portion 15A, which are remote from the folded position of the wiring extension portion 15B2. However, since the adhesion layer 20 is provided to these portions for increasing the adhesion force, the falling-off of the wiring extension portion 15B2 and the wiring connection portion 15A can be effectively prevented. Outside the inclined portion 15H, the base plate surface area on which adhesion layer to be formed is large as compared with that in the case of the wiring extension portion 15B rounded in the corner portion as shown in FIGS. 6 and 7, thereby implementing more effective adhesion.

Figure 11:
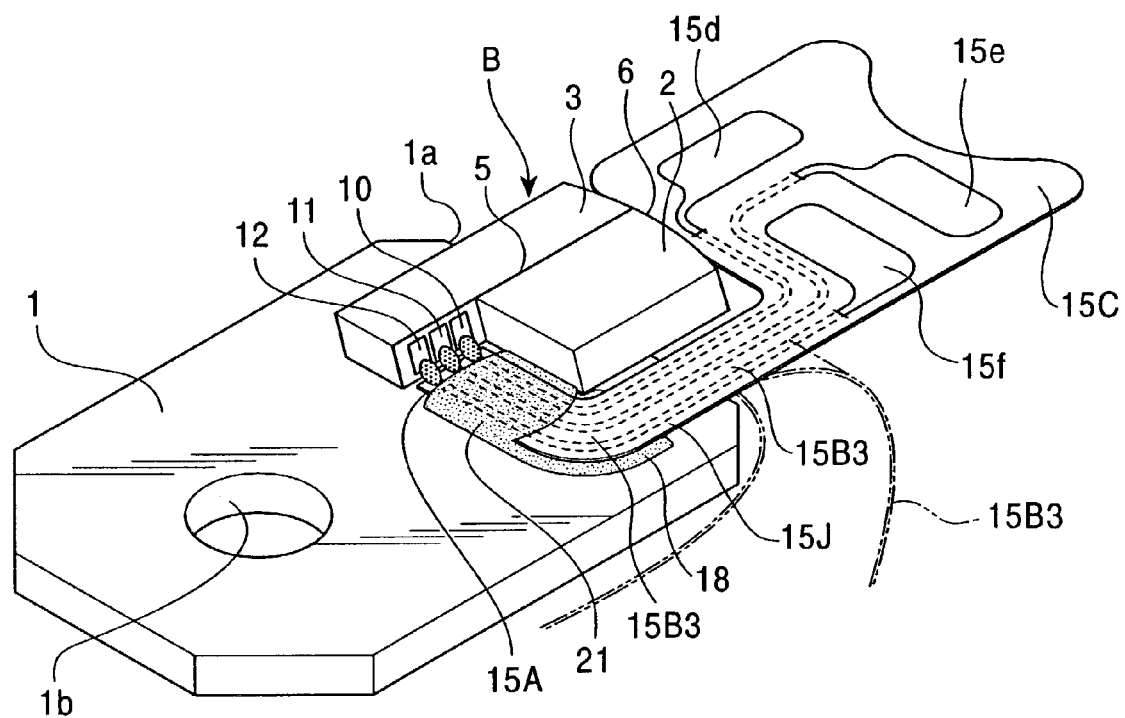
FIG. 11 is a representation explaining a fourth example of an installation portion with respect to the base plate, of the flexible wiring board applied to the magnetic head device shown in FIG. 6, and of a resin adhesion layer.

FIG. 11 shows a configuration in which a wiring extension portion 15B3 of the flexible wiring board 15 is bent into an L-shape having a rounded corner portion, and in which an adhesion layer 21 is applied so as to cover not only the outside portion of the bent portion 15J but also the inside portion of the wiring extension portion 15B3 in the vicinity of the connection terminal portion 15, whereby the wiring extension portion 15B3 of the flexible wiring board 15 is adhered to the base plate. Other arrangements are equal to those of the above-described embodiment shown in FIG. 6.

In the structure of this example, when a wiring extension portion 15B3 is folded along the side of the edge portion 1*a* of the base plate 1, peel strength acts mainly on the bent portion 15J of the wiring extension portion 15B3 and the wiring connection portion 15A, which are remote from the folded portion of the wiring extension portion 15B3. However, since the adhesion layer 21 is provided to these portions for increasing adhesion force, the falling-off of the wiring extension portion 15B3 and the wiring connection portion 15A can be effectively prevented.

A configuration in which the adhesion layer 21 is provided only to the wiring extension portion 15B3 in the vicinity of the connection terminal portion 15A so as to cover the entire width of the wiring extension portion 15B3, is not an arrangement that facilitates obtaining the largest adhesion force.

In the arrangement covering all of only the wiring extension portion 15B3 in the vicinity of the connection terminal portion 15A, it is necessary to increase the amount of adhesive resin to be applied in order to apply a sufficient amount of adhesive resin up to the surface of the base plate so as to run over from the wiring extension portion 15B3. In spite of such an increased amount of adhesive resin used, the adhesive resin located on the wiring extension portion 15B is prone to become useless.

In contrast, by applying adhesive resin around the outer peripheral portion of the wiring connection portion as configurations shown in FIGS. 6 to 10, it is possible to effectively secure an adhesion strength without using a useless amount of adhesive resin. However, when a stronger adhesion force is required, it is desirable to cover all of only the wiring extension portion 15B3, and simultaneously provide the adhesion layer 18 to the outer peripheral portion of the bent portion, as well.

Third Embodiment

Figure 12:
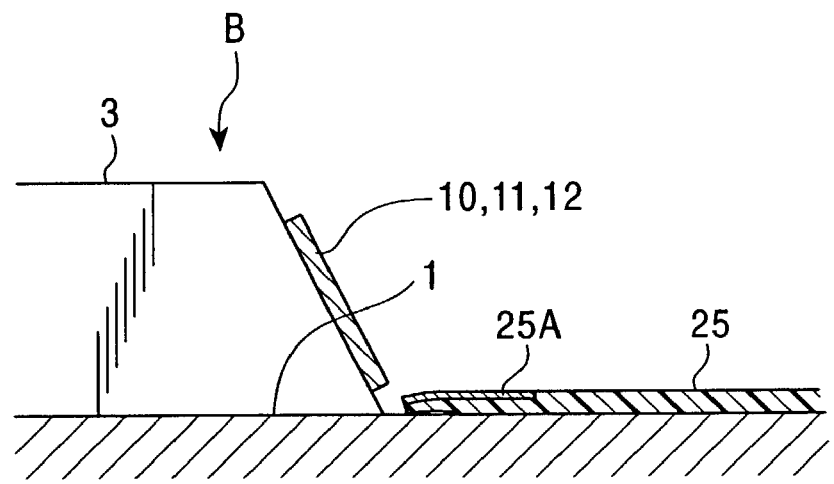
FIG. 12 is a sectional view showing the connection portion of the third embodiment of the magnetic head device according to the present invention.

FIG. 12 is a sectional view showing the connection portion of a third embodiment of a magnetic head device according to the present invention.

In the structure of this embodiment, at the connection terminal portion 25A of the flexible wiring board 25, a resin layer covering the wiring lines of the connection terminal portion 25A is bent in the direction approaching the surface (one surface) of the base plate 1 (in FIG. 12, in the downward direction) along the thickness direction of the connection terminal portion 25A. Other arrangements are equal to those of the above-described first embodiment. The descriptions of the equal portions are omitted.

Figure 13:
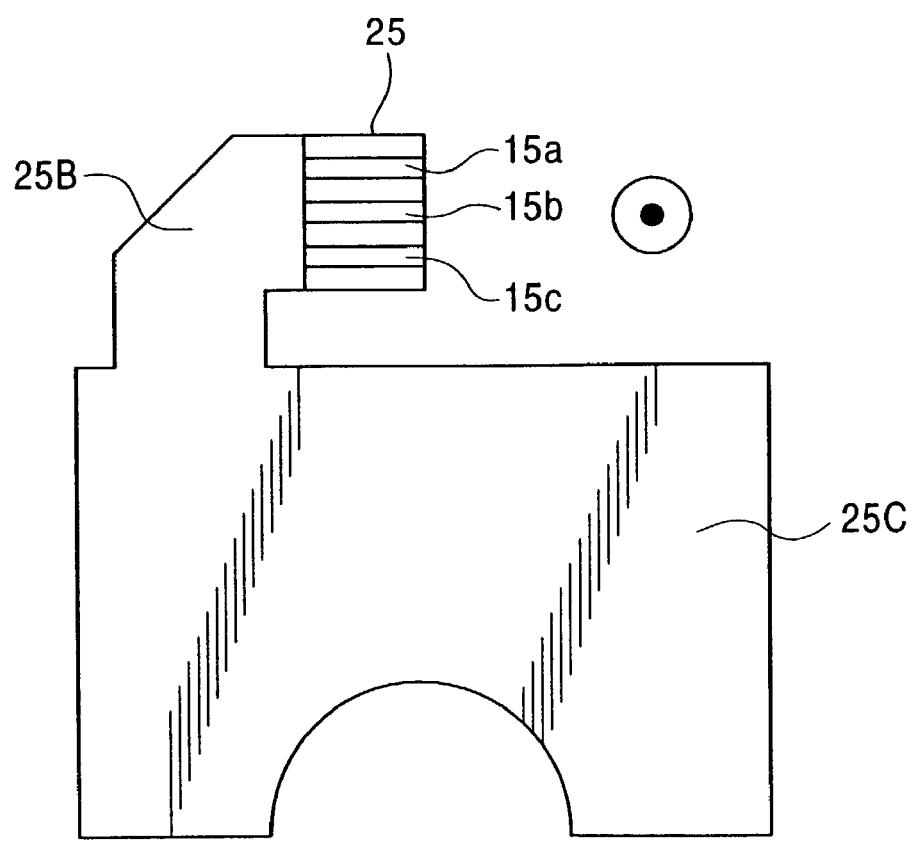
FIG. 13 is a plan view showing a flexible wiring board having the connection portion shown in FIG. 12.
Figure 14:
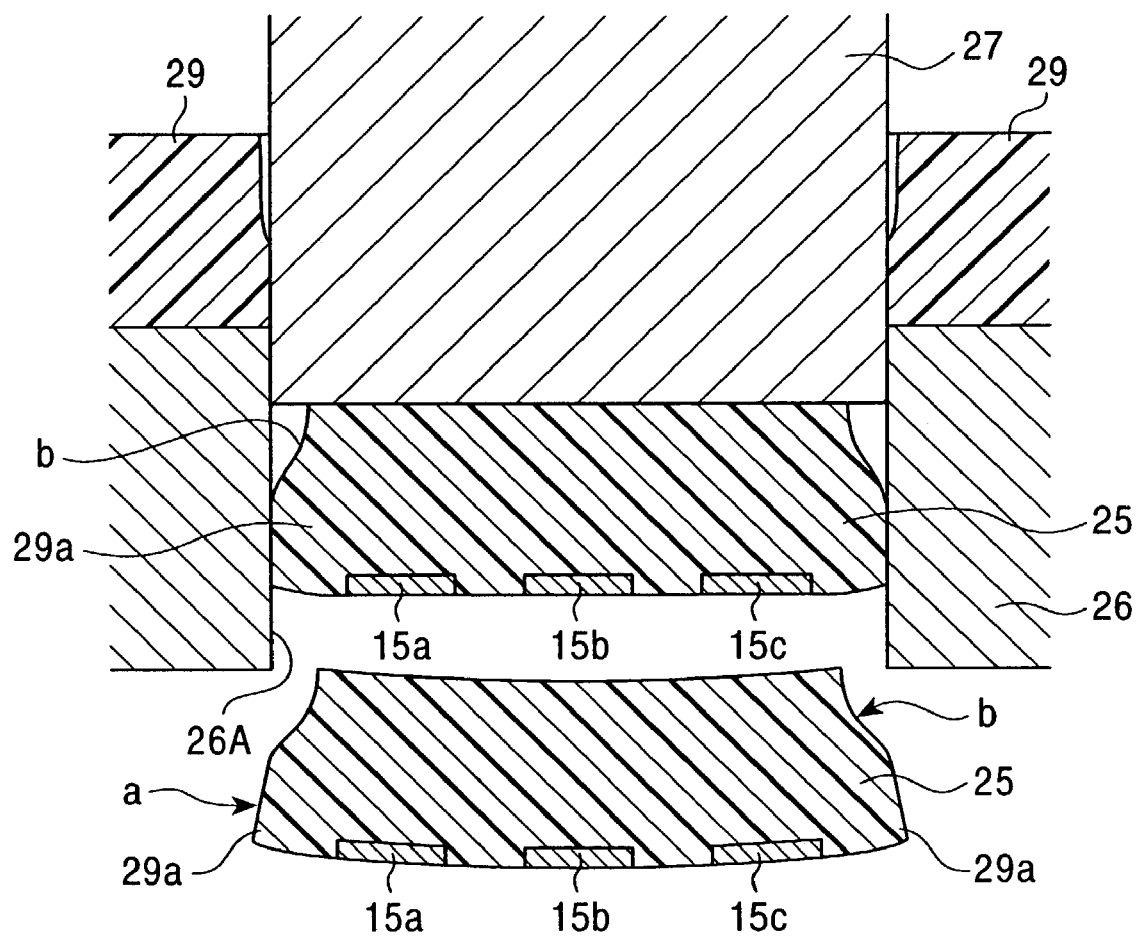
FIG. 14 is a sectional view explaining the flexible wiring board according to the present invention that has been punched out with a dice and a punch.

As shown in FIG. 13, in this embodiment, when the flexible wiring board 25 comprising the connection terminal portion 25A, a wiring extension portion 25B, and an extension terminal portion 25C is to be produced by punching out it from a resin tape 29 using a die 26 and a punch 27 shown in FIG. 14, the flexible wiring board 25 is produced by driving the punch 27 into a die hole (punching hole) 26A from the surface on the side where the wiring lines 15a to 17a are not exposed in the connection terminal portion 25A, as shown in FIG. 14. Also, the same punching direction is shown for the flexible wiring board 25 shown in FIG. 13. Because FIG. 13 represents the surface side where the wiring lines of the connection terminal portion 25A are visible, the punching direction in this case corresponds to the direction from the rear surface side of the plane of FIG. 3 toward the surface side thereof, that is, the punching direction as indicated by a circle mark with a centered dot in FIG. 13.

When the flexible wiring board 25 having a shape as shown in FIG. 13 is punched out from the resin tape 29 using the die 26 and the punch 27, as shown in FIG. 14, about half portions "a" on the bottom surface side in the thickness direction, of the resin tape 29, which are firstly punched out by the punch 27 in the thickness direction while being pressed against the die hole 26A, are punched out by the inner edge portion of the die hole 26A as sharp broken surfaces 29a, but about half portions "b" or the top surface side of the resin tape are punched out as portions "b" with an irregular broken surface caused by forcible tearing. In the flexible wiring board formed into such a punched form, the sides of the punched portions "b" with an irregular broken surface caused by forcible tearing, contract in the direction pulling the resin layer, and consequently the resin layer becomes deformed so as to be convex downward in FIG. 14. Specifically, when the flexible wiring board 25 is opposed to the terminal pads of the magnetic head B as shown in FIG. 12, the connection terminal portion 25A becomes bent downward so as to approach the surface of the base plate 1.

Under such a situation, performing connection between each of the terminal pads 10 to 12 of the magnetic head B and the connection terminal portion 25A by bonding balls, enables ball bonding connection in a satisfactory connecting conditions.

Figure 20:
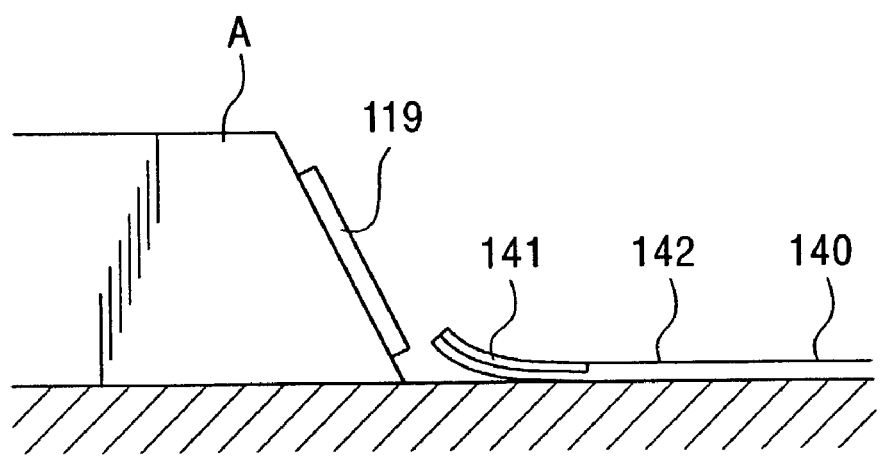
FIG. 20 is a side view showing an example of a connection state between the magnetic head and the flexible wiring board, the connection state being conceived by the present inventor.
Figure 21:
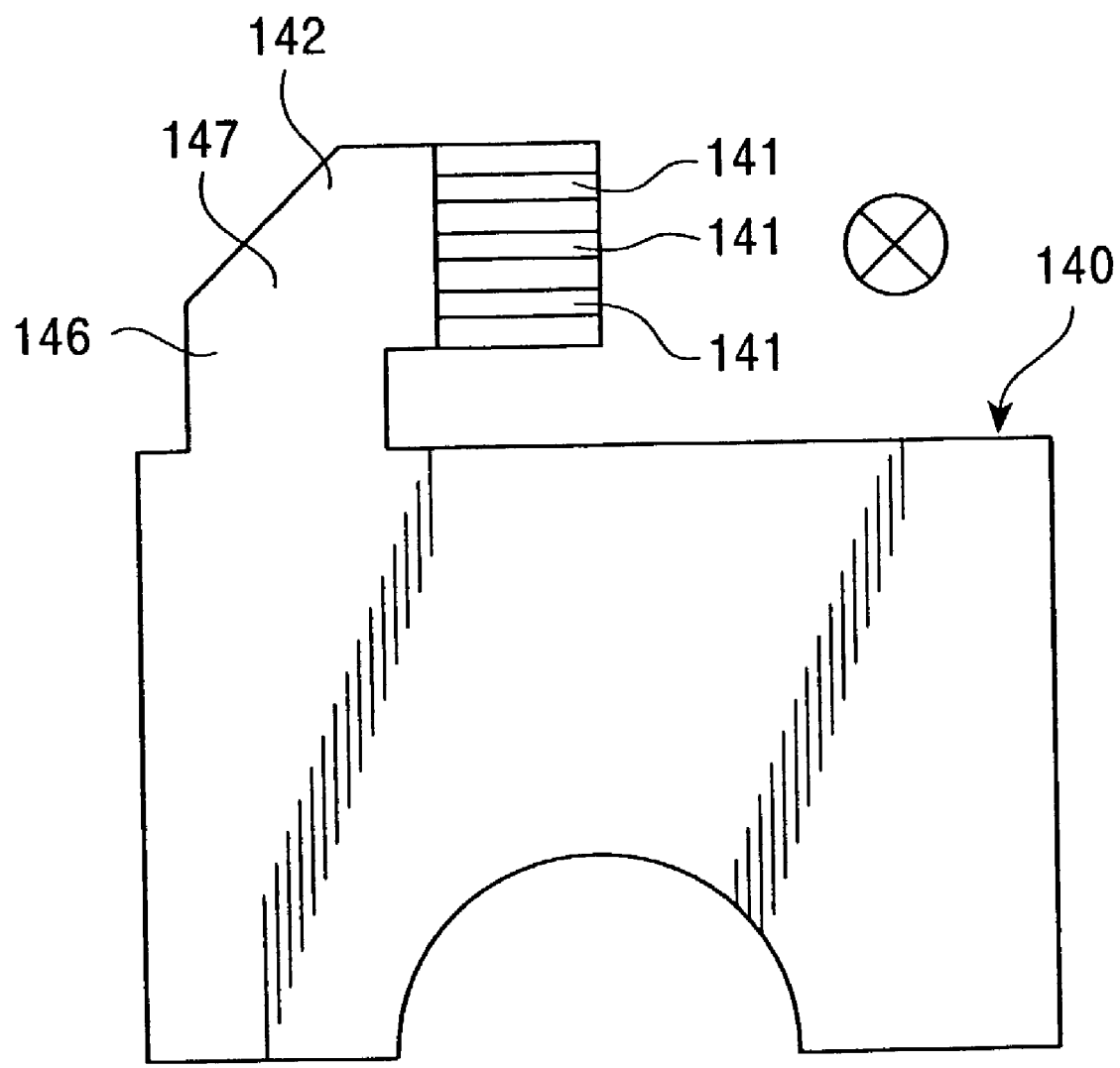
FIG. 21 is a plan view showing an example of a flexible wiring board conceived by the present inventor.

In contrast, if punching is performed not from the direction shown in FIG. 14, but from the direction opposite thereto, that is, if the resin tape is turned inside out, for example, in the state shown in FIG. 14, the connection terminal portion becomes bent in the direction leaving the surface of the base plate as described with reference to the conventional example shown in FIG. 20. Such a situation might raise the problem of causing bad connection during ball bonding, falling-off of ball-bonding portions, cracking in ball-bonding portions or the like. In contrast, the structure of the connection terminal portion 25A shown in FIG. 12 prevents the possibility of causing bad connection during ball bonding, falling-off of ball-bonding portions, cracking in ball-bonding portions or the like, thereby allowing superior connection.

Fourth Embodiment

Figure 15:
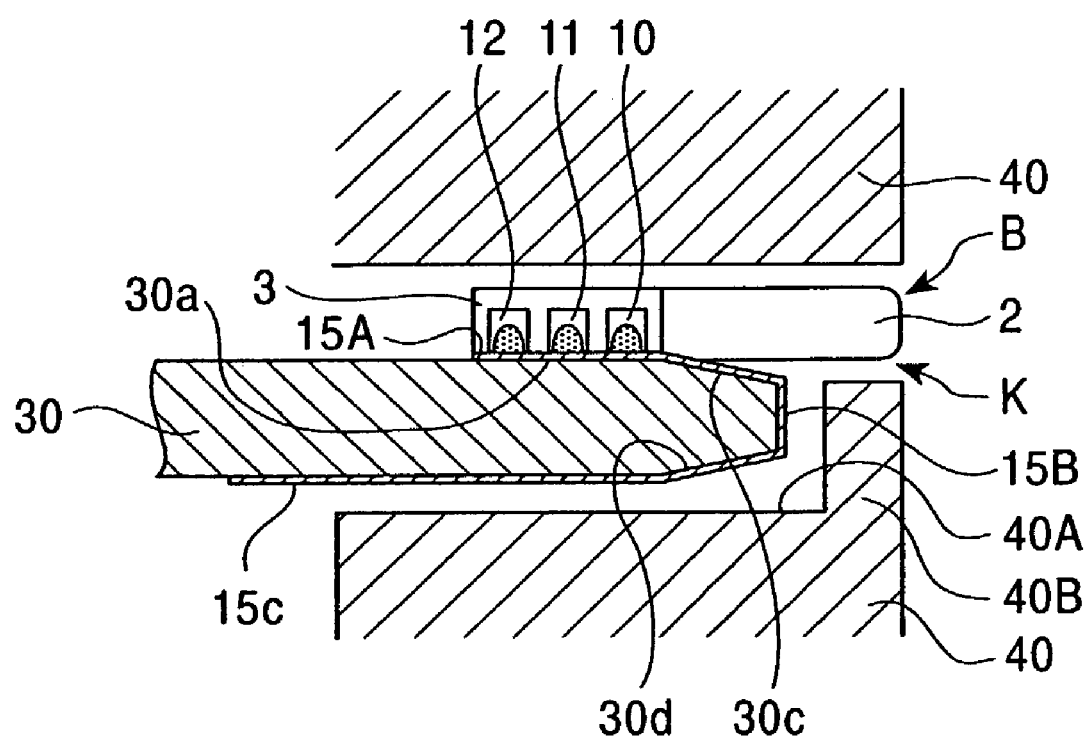
FIG. 15 is a sectional view showing the state in which the fourth embodiment of the magnetic head device according to the present invention is fixed to a rotating cylinder.
Figure 16:
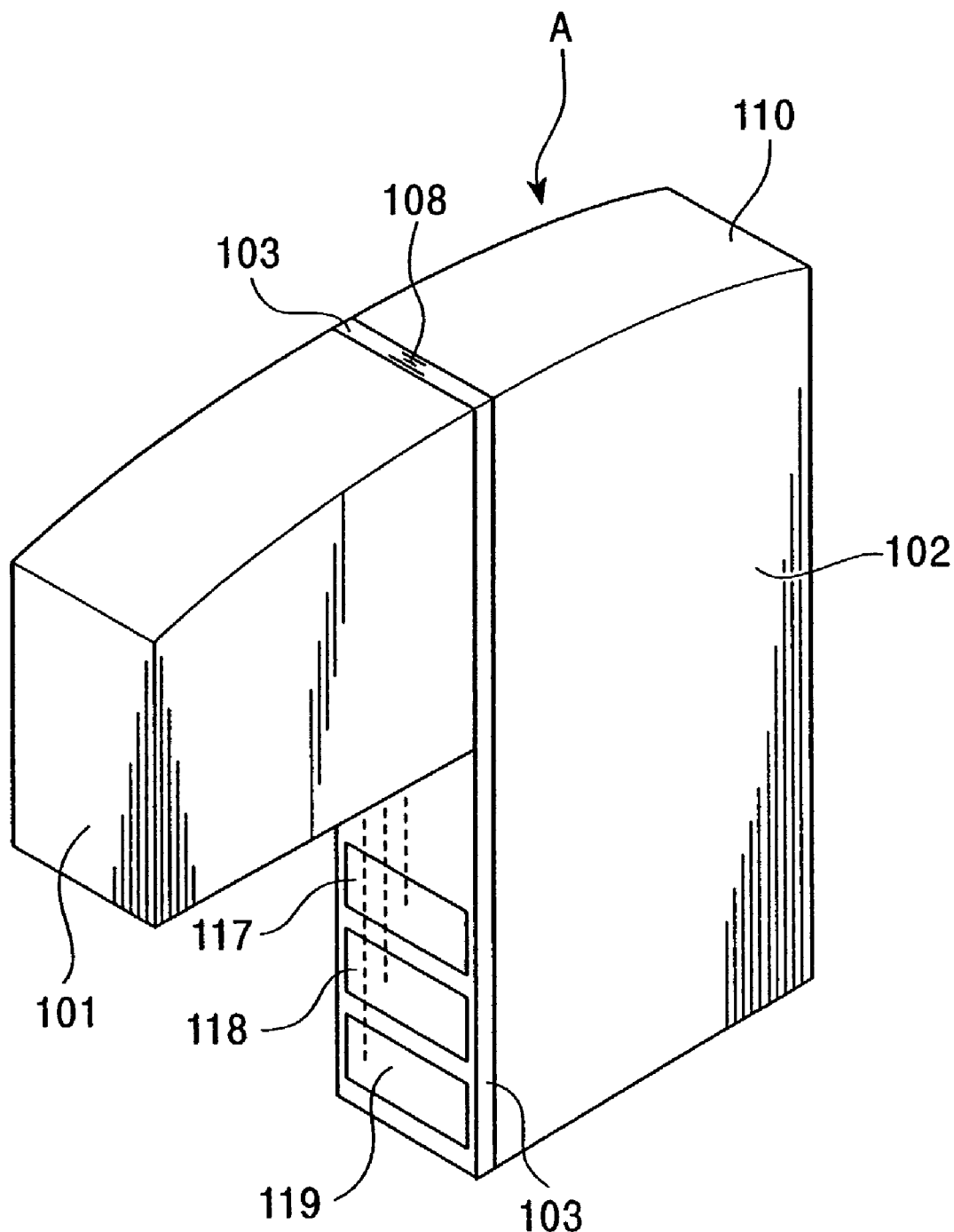
FIG. 16 is a perspective view showing one example of a conventional helical scan type magnetic head.
Figure 17:
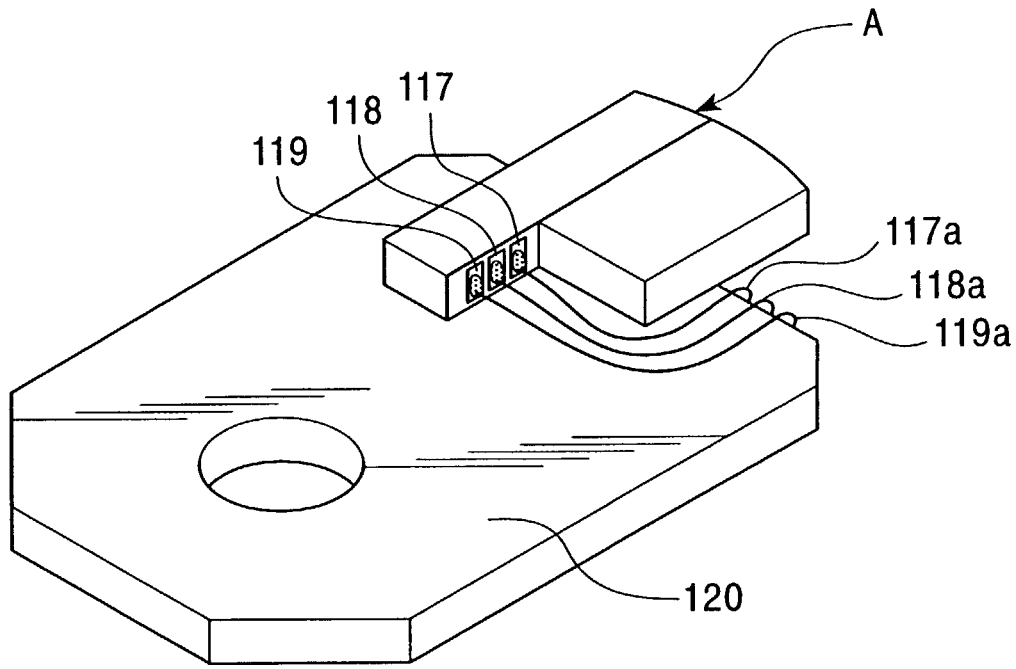
FIG. 17 is a perspective view showing the surface side of the conventional magnetic head device having a configuration in which the magnetic head shown in FIG. 16 is installed on a base plate.
Figure 18:
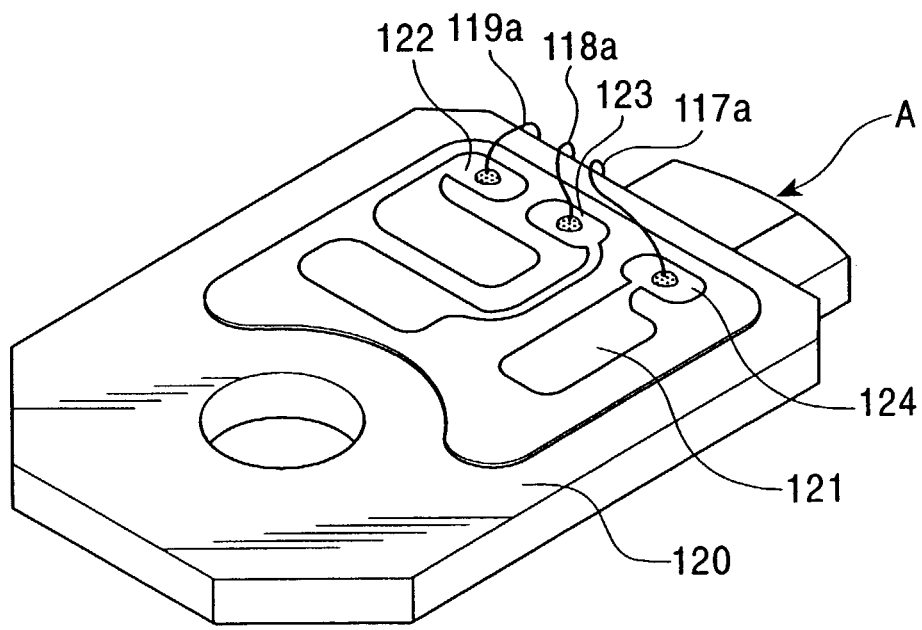
FIG. 18 is a perspective view showing the rear surface side of the conventional magnetic head device having a configuration in which the magnetic head shown in FIG. 16 is installed on the base plate.

FIG. 15 is a sectional view showing the state in which a fourth embodiment of a magnetic head device according to the present invention is fixed to a rotating cylinder.

In the magnetic head device K of this embodiment, the same reference numerals designate the same portions as those in the magnetic head of the above-described first embodiment, and the descriptions of the same portions are omitted.

In the magnetic head device of this embodiment, the magnetic head B is equal to the magnetic head B in the above-described first embodiment. The flexible wiring board 15 is also equal to that in the above-described first embodiment, but the shape of the base plate 30 in this embodiment is formed into a form somewhat different from that of the base plate 1 of the above-described first embodiment.

The base plate 30 of this embodiment is formed equal to the base plate 1 of the above-described first embodiment in that it is formed into an octagonal shape in a plan view obtained by obliquely cutting the four end portions of a metallic plate with a rectangular form in a plan view. Furthermore, the base plate 30 of this embodiment is also formed equal to the base plate 1 of the first embodiment in that the magnetic head B is fixed to the central part of the edge portion 30a of the surface of one side end portion in the longitudinal direction of the base plate 30, and in that an installation hole (not shown in FIG. 15) for installing the base plate 30 in the recess 40A of a rotating cylinder 40 is formed at the central part of the other side end portion in the longitudinal direction of the base plate 30.

In the base plate 30, on the surface side of the edge portion 30a where the magnetic head B is installed, a slope 30c is formed that inclines so as to thin one side end portion of the base plate 30, and also on the rear surface side of the edge portion 30a, a slope 30d is formed such as to thin the end portion of the base plate 30. Although these slopes 30c and 30d are shown as having a planar shape in FIG. 15, they may each have a curved shape.

The wiring extension portion 15B of the flexible wiring board 15, which is to be wrapped around the base plate 30 and adhered thereto from the surface side to the rear surface side thereof, is wound along the above-described slopes 30c and 30d, and is mounted on the base plate 30.

If the slopes 30c and 30d are formed on the edge portion of the base plate 30 in this manner, when the flexible wiring board 15 is folded from the surface side to the rear surface side of the base plate 30, the foldability thereof is improved, thereby facilitating folding. More specifically, when there are not provided slopes 30c and 30d, the flexible wiring board 15 that is to be folded from the surface side to the rear surface side of the base plate 30 is folded at the edge portion of the base plate 30 at a folding angle of 90 degrees. On the other hand, when there are provided slopes 30c and 30d, the flexible wiring board 15 can be folded at the edge portion of the base plate 30 at a folding angle larger than 90 degrees as shown in FIG. 15. This improves the foldability of the flexible wiring board 15 during folding work thereof, thereby preventing the falling-off of the connection terminal portion 15B. In addition, this improved foldability of the flexible wiring board 15 allows the flexible wiring board 15 to closely adhere to the base plate 1, and minimizes adverse effects of the sliding of the magnetic tape on the flexible wiring board 15.

As shown in FIG. 15, because a projected portion 40B is formed at an opening of the recess 40A of the rotating cylinder 40, providing the slope 30d with respect to the projected portion 40B prevents mutual interference between the projected portion 40B and the base plate 30.

This projected portion 40B is formed for narrowing the opening of the recess 40A by somewhat projecting only the core halves 2 and 3 portions from the rotating cylinder 40. Narrowing the opening enables the touch of the magnetic T with respect the peripheral surface of the rotating cylinder 40 to be improved. That is, the projected 40B is provided in order to block the opening at the portion other than the core halves 2 and 3.

While the present invention has been described with reference to what are at present considered to be the preferred embodiments, it is to be understood that various changes and modifications may be made thereto without departing from the present invention in its broader aspects and therefore, it is intended that the appended claims cover all such changes and modifications that fall within the true spirit and scope of the invention.

What is claimed is:

1. A magnetic head device that has, on a base plate, a magnetic head to one of read out and write information by moving relative to a magnetic recording medium, said magnetic head device comprising:

terminal pads formed on a side surface of said magnetic head, said magnetic head being installed on an edge portion of one surface side of said base plate thereby forming a magnetic head installation portion; and a flexible wiring board that includes a connection terminal portion connected to each of the terminal pads of said magnetic head, a wiring extension portion extended from said connection terminal portion, and an extension terminal portion extended from said wiring extension portion, and that is formed by covering a plurality of wiring lines with a resin layer, wherein said connection terminal portion is disposed on said one surface of said base plate adjacently to the terminal pads of the magnetic head on said base plate, said wiring extension portion is folded back toward the other surface side of the base plate along the magnetic head installation portion, said extension terminal portion is mounted on the other surface side of said base plate, said connection terminal portion and each of said terminal pads of said magnetic head are electrically interconnected, an end portion on the side of said magnetic head, of said connection terminal portion of said flexible wiring board is bent in a direction approaching said one surface of said base plate along a thickness direction of said connection terminal portion, on the one surface of said base plate, and irregular broken surfaces caused by forcible tearing are provided on both sides of a cross section of said flexible wiring board on said one surface of said base plate, and sharp broken surfaces are provided adjacent to said terminal connection portion on both sides of the cross section of said flexible wiring board.

2. A magnetic head device according to claim 1, wherein said magnetic head comprises a core block, a magnetic core portion formed at a front end surface side of said core block, and a medium sliding surface including said magnetic core portion, wherein said magnetic head is fixed to the edge portion such that said magnetic core portion is positioned outside said base plate with said core block partly projected from the edge portion of said base plate, and wherein, in the wiring extension portion of said flexible wiring board, a part folded along the edge portion of said base plate is positioned in a gap between a moving locus of a magnetic tape sliding relative to the medium sliding portion of said magnetic head and the edge portion of said base plate.

3. A magnetic head device according to claim 1, wherein, in said magnetic head, a pair of block-shaped core halves are joined together with a core built-in layer sandwiched between side surfaces of the core halves, wherein one of the core halves is formed longer than the other thereof, wherein one portion of the core built-in layer of said one core half is exposed, and wherein the terminal pads are formed on the exposed portion of the core built-in layer on the side surface of said one core half.

4. A magnetic head device according to claim 1, wherein one of a folded part and a bent part is formed at said wiring extension portion of said flexible wiring board, and wherein said one of said folded part and bent part is disposed on the one surface of said base plate so that the connection terminal portion of said flexible wiring board wraps around a side of a shorter core half of said magnetic head therealong such that said connection terminal portion of said flexible wiring board is connected to each of the terminal pads of said magnetic head.

5. A magnetic head device according to claim 1, wherein said flexible wiring board comprises a flexible resin layer and wiring lines embedded therein, wherein one end portion of each of said wiring lines is exposed on one surface side of the resin layer at the connection terminal portion of said flexible wiring board, wherein said resin layer is produced by punching-out performed by driving a punch into a die hole of a die, and wherein said flexible wiring board is produced by punching out from the other surface side of said resin layer.

* * * * *